United States Patent
Law et al.

(10) Patent No.: US 11,618,231 B2
(45) Date of Patent: Apr. 4, 2023

(54) APPARATUS AND METHOD FOR DETECTING FAILURE IN A MECHANICAL PRESS

(71) Applicant: ASMPT SINGAPORE PTE. LTD., Singapore (SG)

(72) Inventors: Kwok Pun Law, Hong Kong (HK); Hong Yeung Li, Hong Kong (HK); Cho Wai Leung, Hong Kong (HK)

(73) Assignee: ASMPT SINGAPORE PTE, LTD., Singapore (SG)

(*) Notice: Subject to any disclaimer, the term of this patent is extended or adjusted under 35 U.S.C. 154(b) by 323 days.

(21) Appl. No.: 16/059,129

(22) Filed: Aug. 9, 2018

(65) Prior Publication Data

US 2020/0047442 A1    Feb. 13, 2020

(51) Int. Cl.
*B30B 15/14* (2006.01)
*B30B 15/18* (2006.01)
(Continued)

(52) U.S. Cl.
CPC ........ *B30B 15/148* (2013.01); *B30B 15/0094* (2013.01); *B30B 15/28* (2013.01); *H01L 21/67092* (2013.01); *H01L 21/67253* (2013.01)

(58) Field of Classification Search
CPC ......... H01L 21/67092; H01L 21/67144; H01L 21/67253; H01L 21/67259; H01L 21/67288; B30B 15/026; B30B 15/26; B30B 15/28; B30B 15/281; B30B 15/0094; B30B 15/148
See application file for complete search history.

(56) References Cited

U.S. PATENT DOCUMENTS 3,348,234 A * 10/1967 Foster ................. B30B 15/0094
                                                        347/231
5,291,814 A *  3/1994 Fierkens ................. B26F 1/40
                                                        257/E23.031
(Continued)

FOREIGN PATENT DOCUMENTS

JP      2010260113 A  * 11/2010
JP      2016-209885 A    12/2016
KR      2002068997 A  *  8/2002 ....... H01L 21/67092

OTHER PUBLICATIONS

Machine translation of JP2010-260113, 7 Pages. (Year: 2010).*

(Continued)

*Primary Examiner* — Jimmy T Nguyen
(74) *Attorney, Agent, or Firm* — Ostrolenk Faber LLP (57) ABSTRACT

A semiconductor device is located between a first die-set part and a second die-set part of a press, and the first and second die-set parts are moved relative to each other for punching and shaping the semiconductor device therebetween. At least one parameter is monitored with at least one sensor attached to the first die-set part and/or the second die-set part at different positions of the first die-set part when it is moving relative to the second die-set part. Variations of the at least one parameter at different relative positions of the first and second die-set parts are compared, and a failure is determined to have occurred when the present variation of the parameter is different from its expected variation during normal operation of the press when there is no failure.

17 Claims, 11 Drawing Sheets

(51) Int. Cl.
*H01L 21/67* (2006.01)
*B30B 15/28* (2006.01)
*B30B 15/00* (2006.01)

(56) References Cited

U.S. PATENT DOCUMENTS

| | | | | |
|---|---|---|---|---|
| 5,379,688 | A * | 1/1995 | Ishii | B30B 15/0041 100/35 |
| 5,450,347 | A * | 9/1995 | Thoms | B21D 22/20 700/146 |
| 6,065,381 | A * | 5/2000 | Kim | B26D 7/1854 83/98 |
| 6,161,407 | A * | 12/2000 | Meisser | B30B 15/0094 72/21.4 |
| 10,486,384 | B2 | 11/2019 | Kurokawa | |
| 2012/0011914 | A1 * | 1/2012 | Kumamoto | H01L 21/4842 72/312 |

OTHER PUBLICATIONS

Machine Translation of KR-10-2002-0068997, Retrieved from http://kposd.kipo.go.kr, Translated Jan. 25, 2021, 4 Pages. (Year: 2002).*

* cited by examiner

APPARATUS AND METHOD FOR DETECTING FAILURE IN A MECHANICAL PRESS

FIELD OF THE INVENTION

The present invention relates to an apparatus and method for detecting failure in a mechanical press, and in particular to a mechanical press used in the assembly of semiconductor devices.

BACKGROUND

A mechanical press may be used during the assembly of semiconductor devices to cut, shape or singulate metallic workpieces. The mechanical press would usually have to exert considerably high forces in order to cut, shape or singulate the metallic workpieces. These high forces are transmitted through multiple components in the mechanical press, thus causing some of these components to wear or fail after a period of usage. When the mechanical press continues to be operated after some of these components have worn out or failed, severe damage may be caused to the mechanical press. Some kinds of damage, for instance, to a die-set of the mechanical press, not only occur frequently, but are also costly to repair or rectify.

In addition, another commonly encountered failure is related to the improper installation of the mechanical press. For instance, a technician may install a wrong spring or altogether forget to install one. Although such errors seem minor, the consequences may be severe as described above. For example, extended operation of the mechanical press with an incorrect spring would result in severe damage to the mechanical press. Such damage would similarly require costly repairs or replacements.

Hence, it would be beneficial to seek to provide an apparatus and method which reduces the likelihood of the aforesaid damages to the mechanical press.

SUMMARY OF THE INVENTION

It is thus an object of this invention to seek to provide an apparatus and a method for detecting failures in a mechanical press, thus preventing costly damage to the press.

According to a first aspect of the invention, there is provided a method of detecting a failure in a press for punching semiconductor devices, comprising the steps of: locating a semiconductor device between a first die-set part and a second die-set part comprised in the press; moving the first die-set part and the second die-set part relative to each other for punching the semiconductor device therebetween; monitoring a parameter with a sensor attached to the first die-set part and/or the second die-set part at different positions of the first die-set part when it is moving relative to the second die set part while punching the semiconductor device; comparing a present variation of the parameter at different positions of the first die-set part relative to the second die-set part against an expected variation of the parameter at positions of the first die-set part relative to the second die-set part during normal operation of the press when there is no failure while punching the semiconductor device; and determining that a failure has occurred in the press when the present variation of the parameter is different from the expected variation of the parameter.

According to a second aspect of the invention, there is provided an apparatus for detecting a failure in a press for punching semiconductor devices, comprising: a first die-set part and a second die-set part which are movable relative to each other for punching a semiconductor device located therebetween; a sensor attached to the first die-set part and/or the second die-set part for monitoring a parameter at different positions of the first die-set part when it is moving relative to the second die set part while punching the semiconductor device; and a processor for comparing a present variation of the parameter at different positions of the first die-set part relative to the second die-set part against an expected variation of the parameter at positions of the first die-set part relative to the second die-set part during normal operation of the press when there is no failure while punching the semiconductor device; wherein the processor is operative to determine that a failure has occurred in the press when the present variation of the parameter is different from the expected variation of the parameter.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENT OF THE INVENTION

Figure 1:
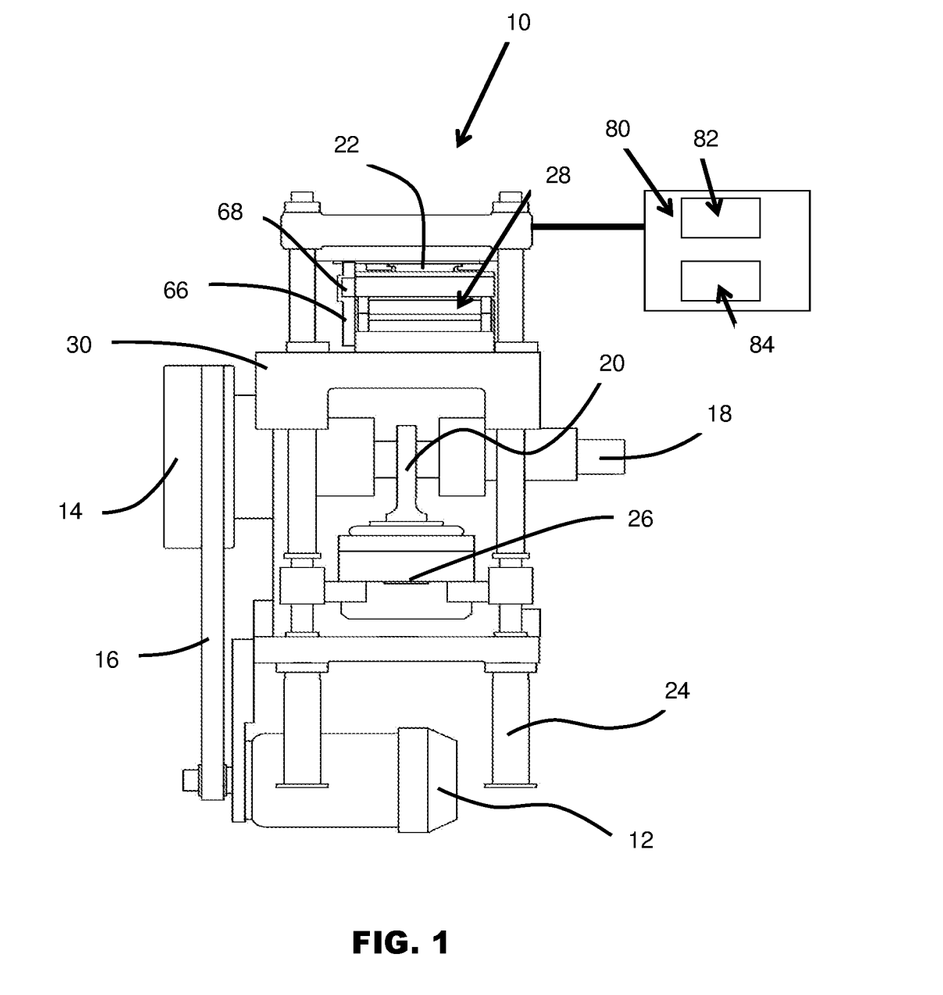
FIG. 1 shows a front view of a press according to the preferred embodiment of the present invention.

FIG. 1 shows a front view of a press 10 according to the preferred embodiment of the present invention. The press 10, which is comprised in an apparatus for detecting failure in the press 10 for punching semiconductor devices, is powered by a motor 12 that is operatively connected to a wheel 14 by a belt 16. The belt 16 transmits rotary motive power from the motor 12 to the wheel 14, which, in turn, rotates a horizontal shaft 18 fixed to the wheel 14. When the shaft 18 rotates, a crank 20 coupled to the shaft 18 is moved vertically up or down relative to the shaft 18. A die-set 28 comprises a top coupler 22 to couple the die-set 28 to columns 24. The die-set 28 is connected to the crank 20 by the columns 24, such that the die-set 28, the columns 24 and the crank 20 move together up or down when driven by the motor 12. The press 10 comprises a body frame 30, which is generally fixed in position. Hence, the crank 20, together with the columns 24 and the die-set 28, is movable relative to the body frame 30.

The die-set 28 is operable to hold a workpiece for processing. A first sensor comprising a force sensor 26, such as a load cell, may be used for measuring a reaction force from the workpiece during the processing of the workpiece in the die-set 28. The force sensor 26 may be located in any suitable location, such as below the crank 20 or coupled to the die-set 28. The press 10 further comprises a computer 80 operationally connected to the die-set 28, wherein the computer 80 comprises a processor 82 and memory 84. Appropriate software is installed in the computer 80 to control and monitor the press 10.

Figure 2:
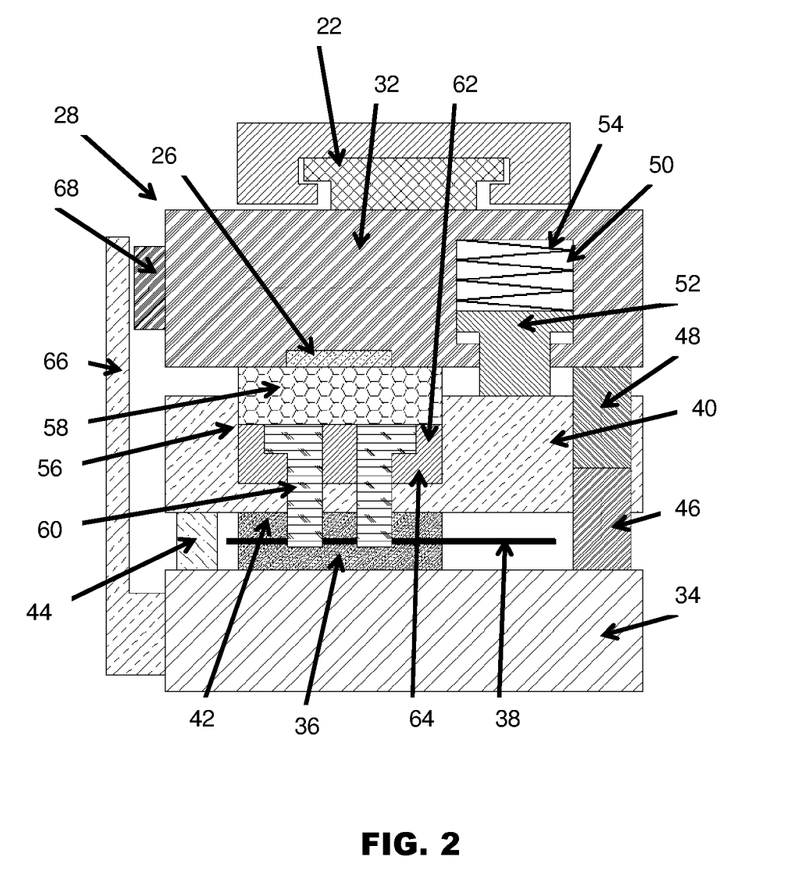
FIG. 2 shows a cross-sectional view of a die-set of FIG. 1.

FIG. 2 shows a cross-sectional view of the die-set 28 of FIG. 1. The die-set 28 comprises a first die-set part or top die-set housing 32 attached to the columns 24, and a second die-set part or bottom die-set housing 34 mounted onto the body fame 30. Hence, the top and bottom die-set housings 32, 34 are movable relative to each other for punching a workpiece 38 located therebetween. The workpiece 38 may be a lead frame or a semiconductor device. The die-set 28 further comprises an intermediate plate 40 independently movable relative to both the top and bottom die-set housings 32, 34. A workpiece 38 may be clamped between a die insert 36 fixed to the bottom die-set housing 34 and a guide insert 42 affixed to the intermediate plate 40.

A plate stopper 44 installed to the bottom die-set housing 34 prevents the intermediate plate 40 from moving too close to the bottom die-set housing 34 by contacting the intermediate plate 40 when it moves to a predetermined vertical distance away from the bottom die-set housing 34. Similarly, a bottom die-set stopper 46 on the bottom die-set housing 34 contacts an opposing top die-set stopper 48 fixed to the top die-set housing 32 to prevent the top die-set housing 32 from moving too close to the bottom die-set housing 34. Components in the press 10 may be damaged if the top die-set housing 32, bottom die-set housing 34 and intermediate plate 40 are allowed to move too close to one another, particularly since they are subject to strong forces commonly used in presses 10.

The top die-set housing 32 comprises a bushing cavity 50 with protrusions at its mouth to retain a T-shaped distance bushing 52 in the bushing cavity 50, and a resilient member 54, such as a compression spring. The resilient member 54 is urged between the distance bush 52 and an internal wall of the bushing cavity 50 to enable the distance bushing 52 to move reciprocally within the bushing cavity 50. While a broader end of the T-shaped distance bushing 52 is retained within the bushing cavity 50, an opposite narrower end protrudes out of the bushing cavity 50 and is operative to press against the intermediate plate 40. Hence, when the intermediate plate 40 moves towards the top die-set housing 32 and pushes against the narrower end of the distance bushing 52, the resilient member 54 is compressed. Thus, the resilient member 54 provides a reaction force, which is transmitted through the distance bushing 52 to the intermediate plate 40, to oppose the pushing motion.

A punch assembly 56 is attached to the top die-set housing 32 by a punch plate 58. Two punches 60 are secured against the punch plate 58 by a punch holder 62. Although two punches 60 are illustrated in FIG. 2, this is for illustration purposes only. The punch assembly 56 may comprise fewer or more punches 60. The punches 60 are operable to cut, shape or singulate the workpiece 38 clamped between the guide insert 42 and the die insert 36. The intermediate plate 40 comprises a punch cavity 64 sized to accommodate the punch assembly 56.

The die-set 28 is movable between a closed position wherein the bottom die-set stopper 46 and the top die-set stopper 48 contact each other, and an open position wherein the bottom die-set stopper 46 and the top die-set stopper 48 are spaced away from each other. A position scale bar 66 attached to the bottom die-set housing 34 cooperates with a second sensor comprising a position sensor 68 attached to the top die-set housing 32 to determine a distance between the bottom die-set housing 34 and the top die-set housing 32. The force sensor 26 may be located above the punch assembly 56 in order to measure a reaction force from the workpiece 38 or the die insert 36 when the punches 60 push against the workpiece 38 or the die insert 36 in the closed position.

Figure 3A:
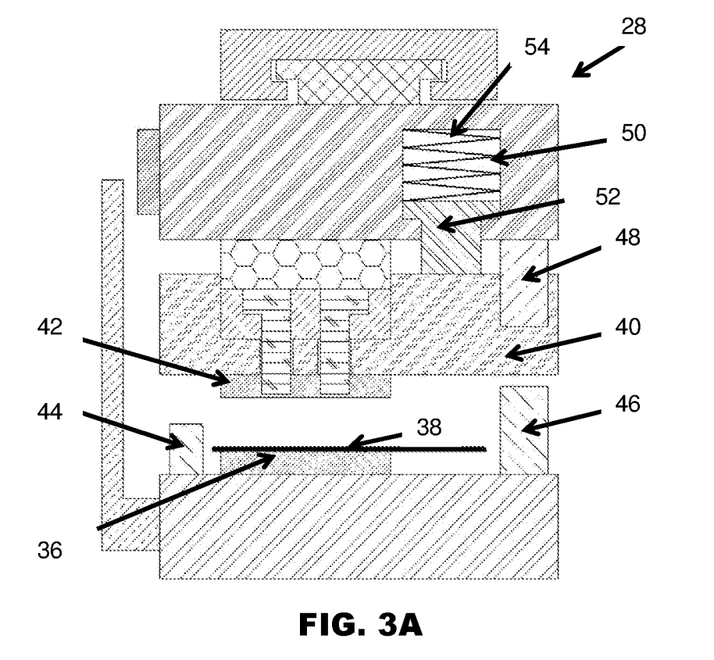
FIGS. 3A-3C illustrate the operation of the die-set of FIG. 2, when moving from an open position to a closed position.
Figure 3B:
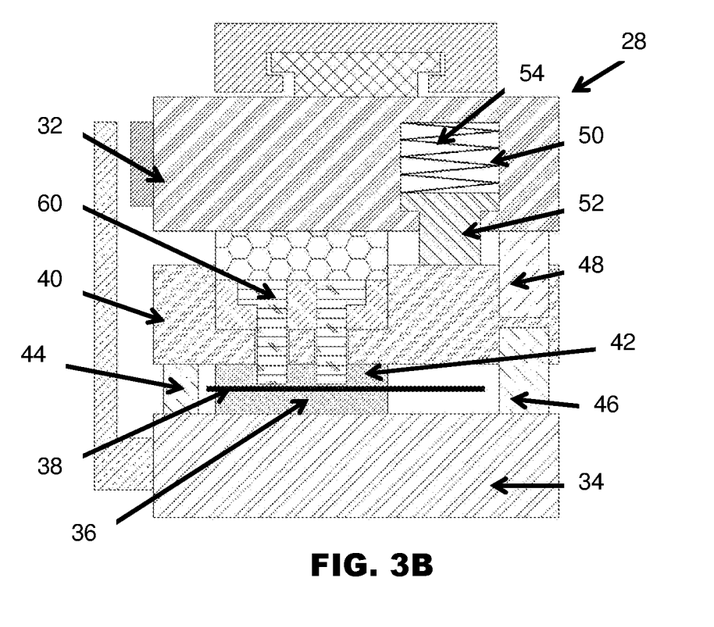
Figure 3C:
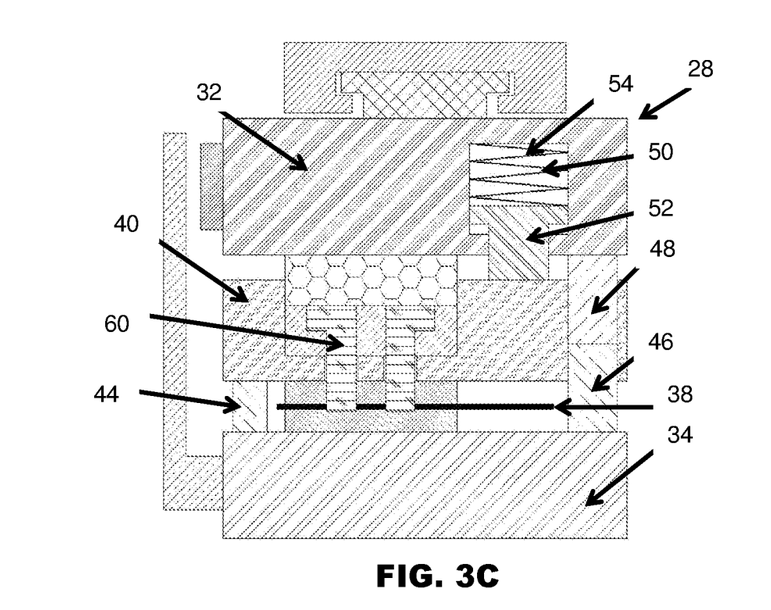

FIGS. 3A-3C illustrate the operation of the die-set 28 of FIG. 2, when moving from the open position to the closed position. FIG. 3A shows the die-set 28 in the open position, wherein the bottom die-set stopper 46 and the top die-set stopper 48 are spaced away from each other. The plate stopper 44 is also not in contact with the intermediate plate 40. The resilient member 54 is extended and urges the broader end of the distance bushing 52 against the protrusions at the mouth of the bushing cavity 50. In this open position, the workpiece 38 may be freely placed onto or removed from the die insert 36 because the die-set 28 is not clamping onto the workpiece 38.

After the workpiece 38 has been placed onto the die insert 36, the top die-set housing 32 and the bottom die-set housing 34 are moved towards each other until the guide insert 42 contacts the workpiece 38, in a contact position, as shown in FIG. 3B. Although the plate stopper 44 is now in contact with the intermediate plate 40, the bottom die-set stopper 46 and the top die-set stopper 48 are still not in contact with each other. The resilient member 54 is still extended, urging the broader end of the distance bushing 52 against the protrusions at the mouth of the bushing cavity 50. In this contact position, the punches 60 are not in contact with the workpiece 38.

As the top die-set housing 32 and the bottom die-set housing 34 continue to move relative to and towards each other, the intermediate plate 40 remains stationary relative to the bottom die-set housing 34 because the plate stopper 44 prevents the intermediate plate 40 from moving any closer to the bottom die-set housing 34. Thus, the top die-set housing 32 moves nearer to both the bottom die-set housing 34 and the intermediate plate 40 until the bottom die-set stopper 46 and the top die-set stopper 48 contact each other, in the closed position, as shown in FIG. 3C. While the top die-set housing 32 is moving closer to the intermediate plate 40, the intermediate plate 40 pushes against the distance bushing 52, thus moving the distance bushing 52 into the bushing cavity 50 and compressing the resilient member 54. The punches 60, meanwhile, press against the workpiece 38 to cut, shape or singulate the workpiece 38. In this closed position, the top die-set housing 32 and the bottom die-set housing 34 are prevented from moving any closer to each other by the bottom die-set stopper 46 and the top die-set stopper 48, which are in contact with each other.

Figure 4A:
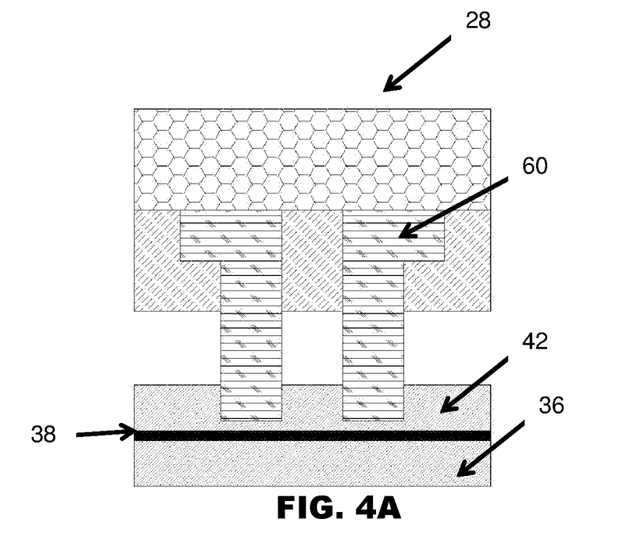
FIGS. 4A-4C illustrate the cutting of a workpiece with punches.
Figure 4B:
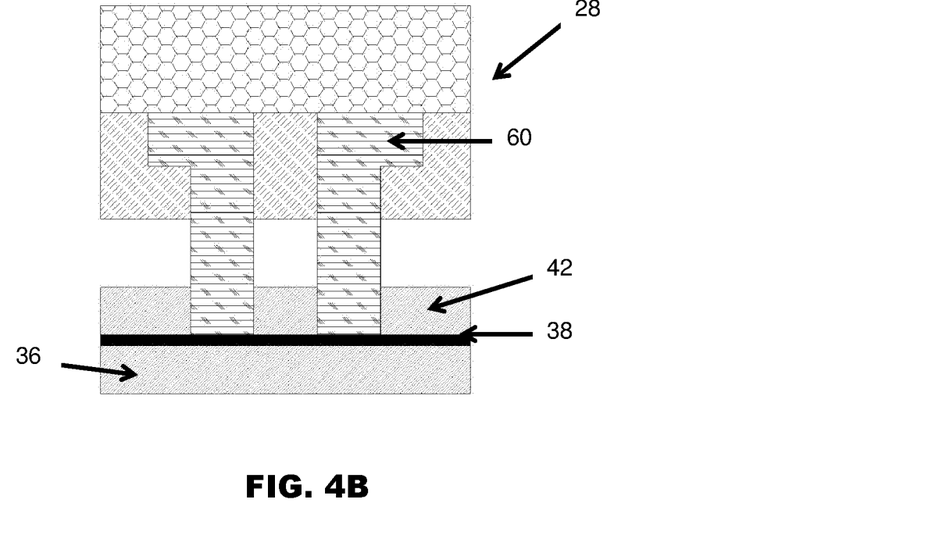
Figure 4C:
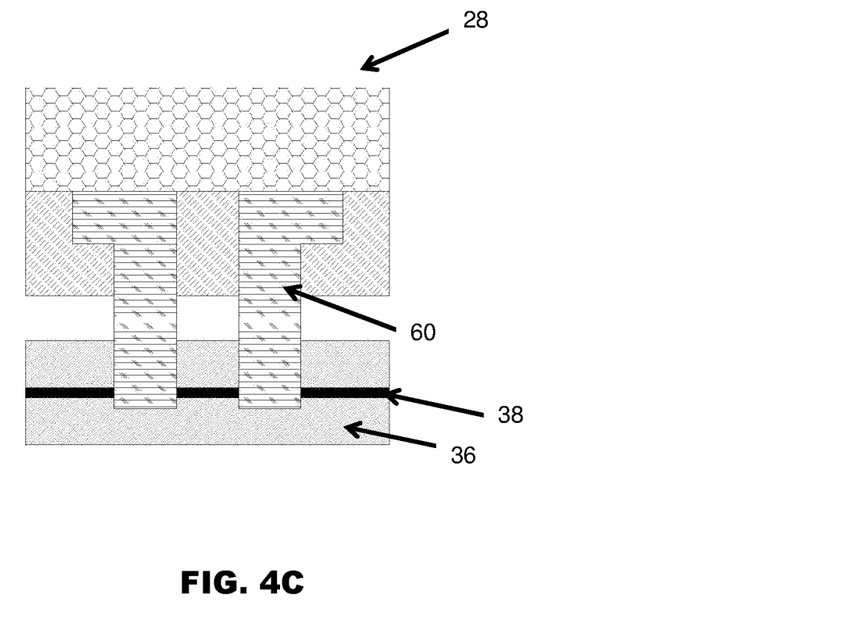

FIGS. 4A-4C illustrate the cutting of a workpiece 38 with the punches 60. FIG. 4A shows the die-set 28 in the contact position, wherein the die insert 36 and the guide insert 42 are both in contact with the workpiece 38 but the punches 60 have not yet come into contact with the workpiece 38. FIG. 4B shows the die-set 28 as it is moving from the contact position to the closed position, wherein the die insert 36 and the guide insert 42 are clamping onto the workpiece 38 and the punches 60 have just come into contact with the workpiece 38. FIG. 4C shows the die-set 28 in the closed position, wherein the punches 60 have cut through the workpiece 38 to contact the die insert 36.

Figure 5A:
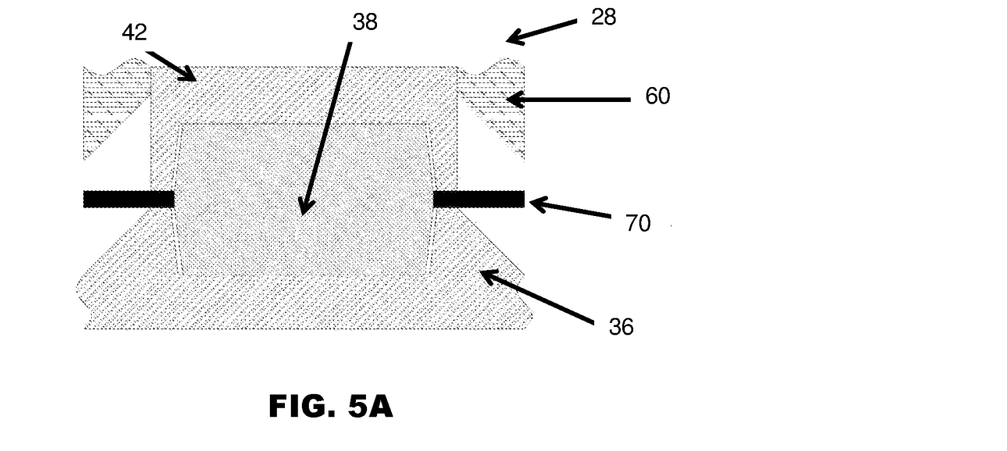
FIGS. 5A-5C illustrate the shaping of another workpiece with different punches.
Figure 5B:
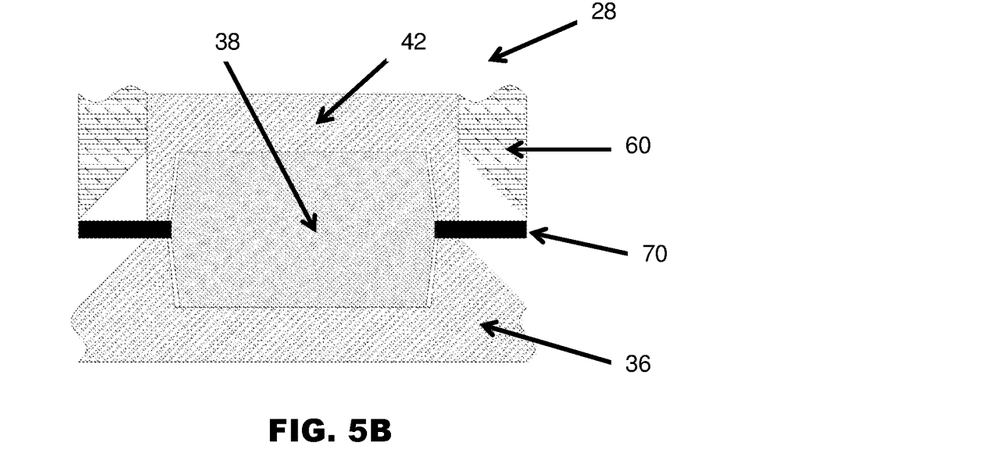
Figure 5C:
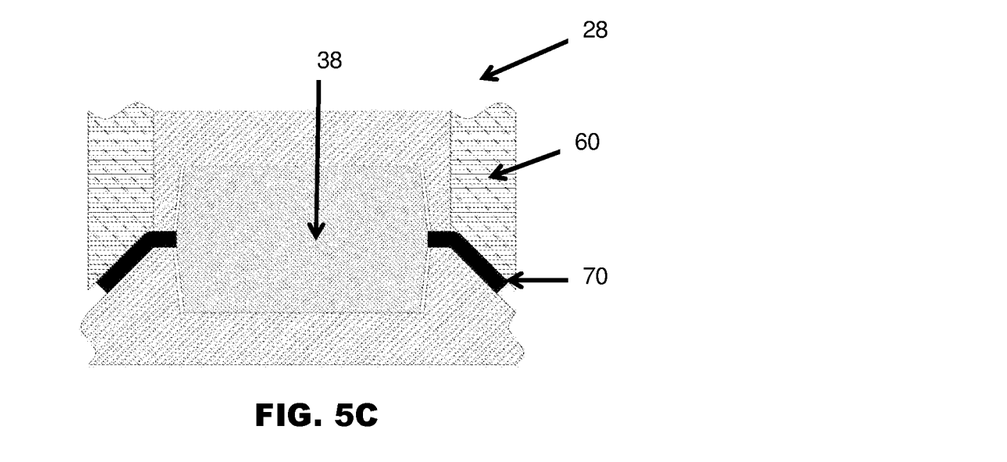

FIGS. 5A-5C illustrate the shaping of another workpiece 38 with different punches 60. In this example, the workpiece 38 is a packaged semiconductor device with leads 70 that are to be shaped or bent. FIG. 5A shows the die-set 28 in the contact position, wherein the die insert 36 and the guide insert 42 are both in contact with the workpiece 38 but the punches 60 have not yet come into contact with the workpiece 38. FIG. 5B shows the die-set 28 as it is moving from the contact position to the closed position, wherein the die insert 36 and the guide insert 42 are clamping onto the workpiece 38 and the punches 60 have just come into contact with the workpiece 38. FIG. 5C shows the die-set 28 in the closed position, wherein the punches 60 have bent the leads 70 of the workpiece 38.

Figure 6A:
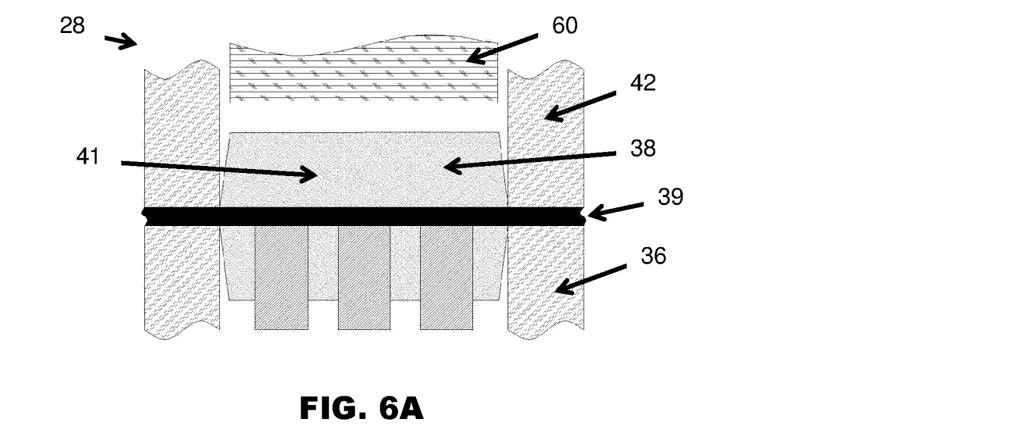
FIGS. 6A-6C illustrate the singulation of yet another workpiece with a different punch.
Figure 6B:
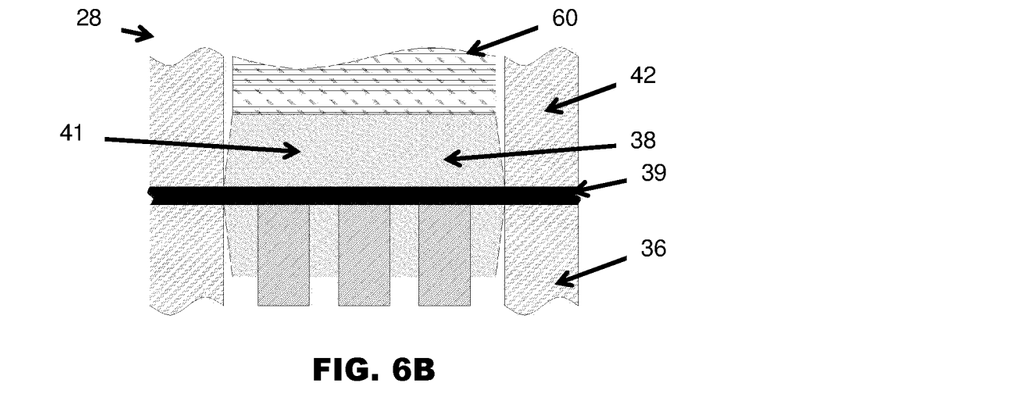
Figure 6C:
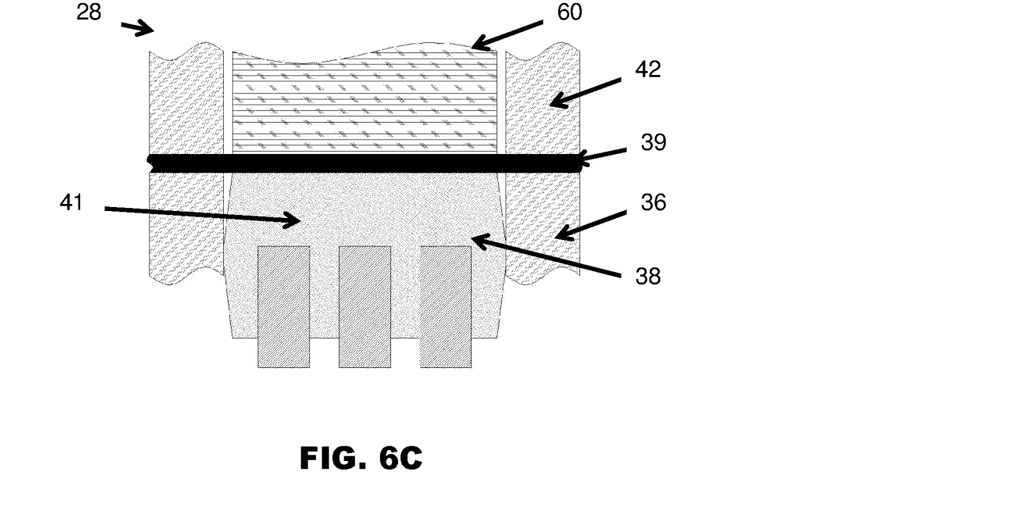

FIGS. 6A-6C illustrate the singulation of yet another workpiece 38 with a different punch 60, wherein the workpiece 38 comprises a packaged semiconductor device 41 formed on a lead frame 39. FIG. 6A shows the die-set 28 in the contact position, wherein the die insert 36 and the guide insert 42 are both in contact with the workpiece 38 to be singulated but the punch 60 has not yet come into contact with the workpiece 38. FIG. 6B shows the die-set 28 as it is moving from the contact position to the closed position, wherein the die insert 36 and the guide insert 42 are clamping onto the lead frame 39 and the punch 60 has just come into contact with the packaged semiconductor device 41. FIG. 6C shows the die-set 28 in the closed position, wherein the punch 60 has singulated the workpiece 38 by separating the packaged semiconductor device 41 from the lead frame 39.

After cutting, shaping or singulation the workpiece 38, the die-set 28 moves from the closed position back to the open position, thus completing one processing cycle. The cut, shaped or singulated workpiece 38 may then be removed and another unworked workpiece 38 may be placed in the die-set 28 for a next processing cycle.

The whole processing cycle, from the open position to the closed position and back to the open position again, may be controlled and monitored by the computer 80. The computer 80 collects data from sensors, such as the force sensor 26 and the position sensor 68, installed in the press 10 and stores the data in the memory 84. The computer 80 runs an appropriate piece of software to analyze the collected data in order to detect any anomaly or failure in the press 10. If an anomaly or failure is detected, the press 10 is stopped, which may be immediately or at the end of the processing cycle, thus preventing a costly machine malfunction from occurring.

Figure 7A:
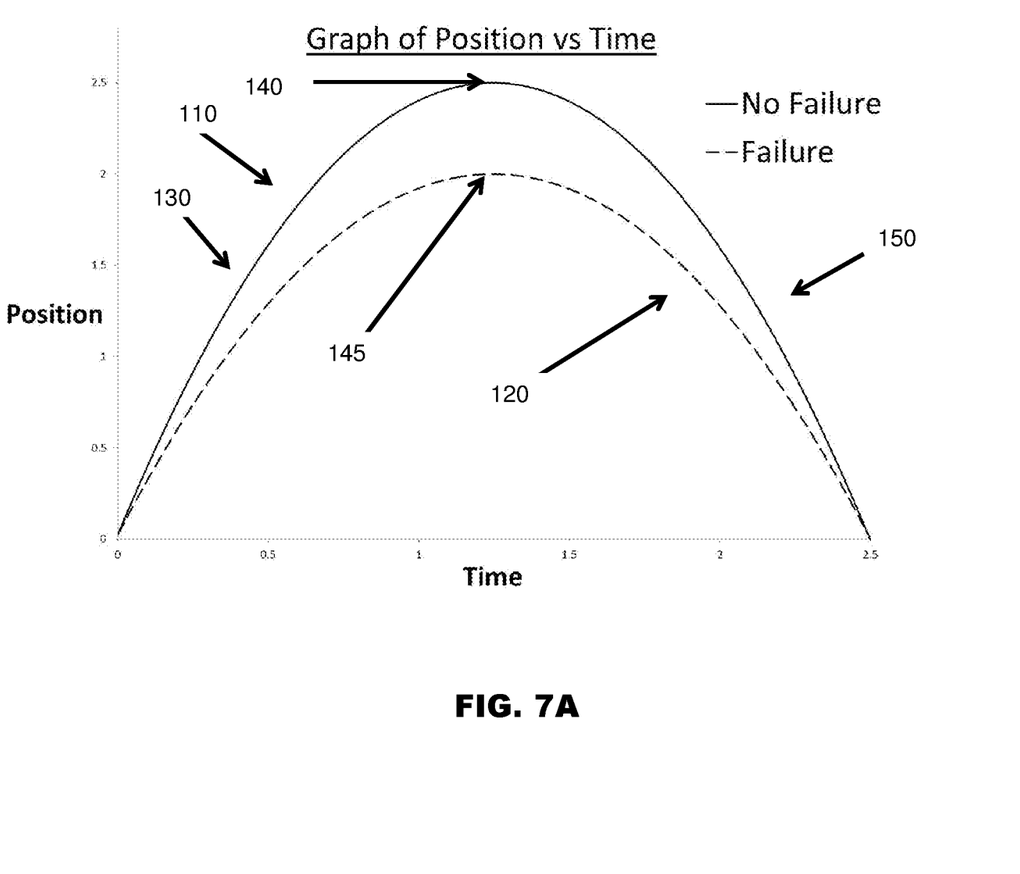
FIGS. 7A-7C illustrate examples of how collected data may be analyzed to detect an anomaly or failure in the press.
Figure 7B:
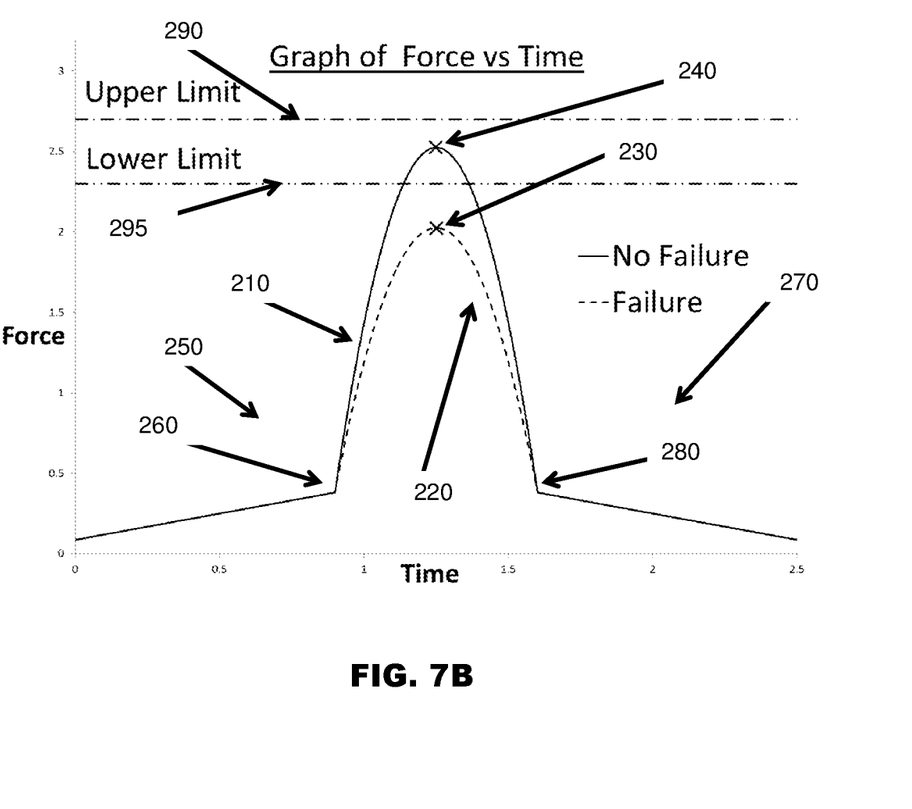
Figure 7C:
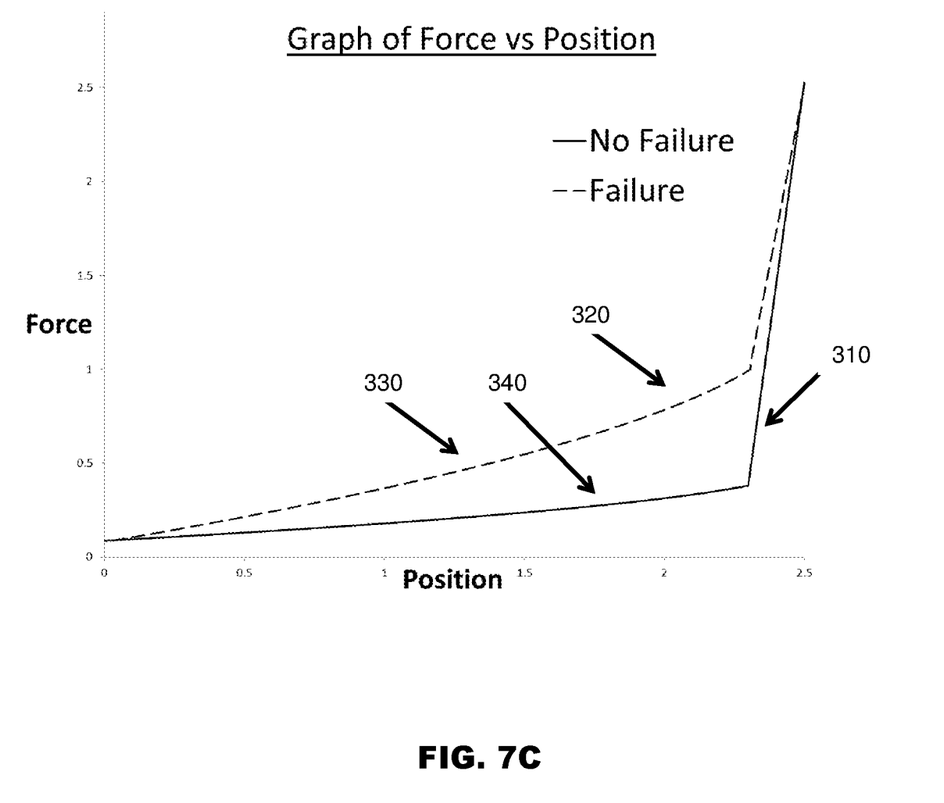

FIGS. 7A-7C illustrate examples of how the collected data may be analyzed to detect an anomaly or failure in the press 10. FIG. 7A shows a first parameter comprising position data of a location of the first die-set part relative to the second die-set part while punching the semiconductor device from the position sensor 68, plotted against time, wherein an expected position-time variation or a normal position-time graph 110 illustrating a processing cycle of the press 10 without any anomaly is compared to a present position-time variation or an abnormal position-time graph 120 illustrating a processing cycle of the press 10 with an anomaly. The present position-time variation of the first parameter comprises the locations of the first die-set part relative to the second die-set part over time during the operation of the press 10 while punching the semiconductor device. A rising portion 130 of the normal position-time graph 110 depicts the operation of the die-set 28 from the open position to the closed position, a peak 140 depicts the die-set 28 in the closed position, and a falling portion 150 depicts the operation of the die-set 28 from the closed position back to the open position. While the abnormal position-time graph 120 has a similar shape, a peak 145 of the abnormal position-time graph 120 is lower than the peak 140 of the normal position-time graph 110. This suggests that there is an anomaly in the press 10, which, in this case, is that wrong stoppers 44, 46, 48 have been installed. The computer 80 determines a failure has occurred in the press 10 when the present position-time variation is different from the expected position-time variation. Hence, if the computer 80 identifies the abnormal position-time graph 120, it may, for instance, stop the operation of the press 10 immediately or at the end of the processing cycle.

FIG. 7B shows a second parameter comprising force data of a pressing force exerted by a punch 60 on the semiconductor device while punching the semiconductor device from the force sensor 26, plotted against time, wherein an expected force-time variation or a normal force-time graph 210 illustrating a processing cycle of the press 10 without any anomaly is compared to a present force-time variation or an abnormal force-time graph 220 illustrating a processing cycle of the press 10 with an anomaly. The present force-time variation comprises the pressing force exerted by the punch 60 on the semiconductor device over time during the operation of the press 10 while punching the semiconductor device. A rising portion 250 depicts the operation of the die-set 28 from the open position to the closed position, peaks 230, 240 depict the die-set 28 in the closed position, and a falling portion 270 depicts the operation of the die-set 28 from the closed position back to the open position. A first kink 260 indicates the moment when the punches 60 come into contact with the workpiece 38, and they remain in contact until the moment indicated by a second kink 280 when the punches 60 separate from the workpiece 38. An upper limit 290 and a lower limit 295 have been defined to determine whether the present force-time variation is normal or not. As long as the present force-time variation is within the upper limit 290 and the lower limit 295, the processing cycle would be deemed normal. However, if the present force-time variation falls outside of the upper limit 290 or the lower limit 295, then the processing cycle would be considered to be abnormal. Therefore, although the abnormal force-time graph 220 looks similar to the normal force-time graph 210, the abnormal force-time graph 220 is abnormal because it is below the lower limit 295. This suggests that there is an anomaly in the press 10, which, in this case, is that one or more of the punches 60 are broken or have been improperly installed. The computer 80 determines a failure has occurred in the press 10 when the present force-time variation is different from the expected force-time variation. Hence, if the computer 80 identifies the abnormal force-time graph 220, it may, for instance, stop the operation of the press 10 immediately or at the end of the processing cycle.

FIG. 7C shows force data from the force sensor 26 plotted against the position data from the position sensor 68, wherein an expected force-position variation or a normal force-position graph 310 illustrating a processing cycle of the press 10 without any anomaly is compared to a present force-position variation or an abnormal force-position graph 320 illustrating a processing cycle of the press 10 with an anomaly. A sloping portion 330 of the abnormal force-position graph 320 is steeper than a corresponding sloping portion 340 of the normal force-position graph 310. This suggests that there is an anomaly in the press 10, which, in this case, is that an incorrect resilient member 54 has been installed. The computer 80 determines a failure has occurred in the press 10 when the present force-position variation is different from the expected force-position variation. Hence, if the computer 80 identifies the abnormal force-position graph 320, it may, for instance, stop the operation of the press 10 immediately or at the end of the processing cycle.

Figure 8:
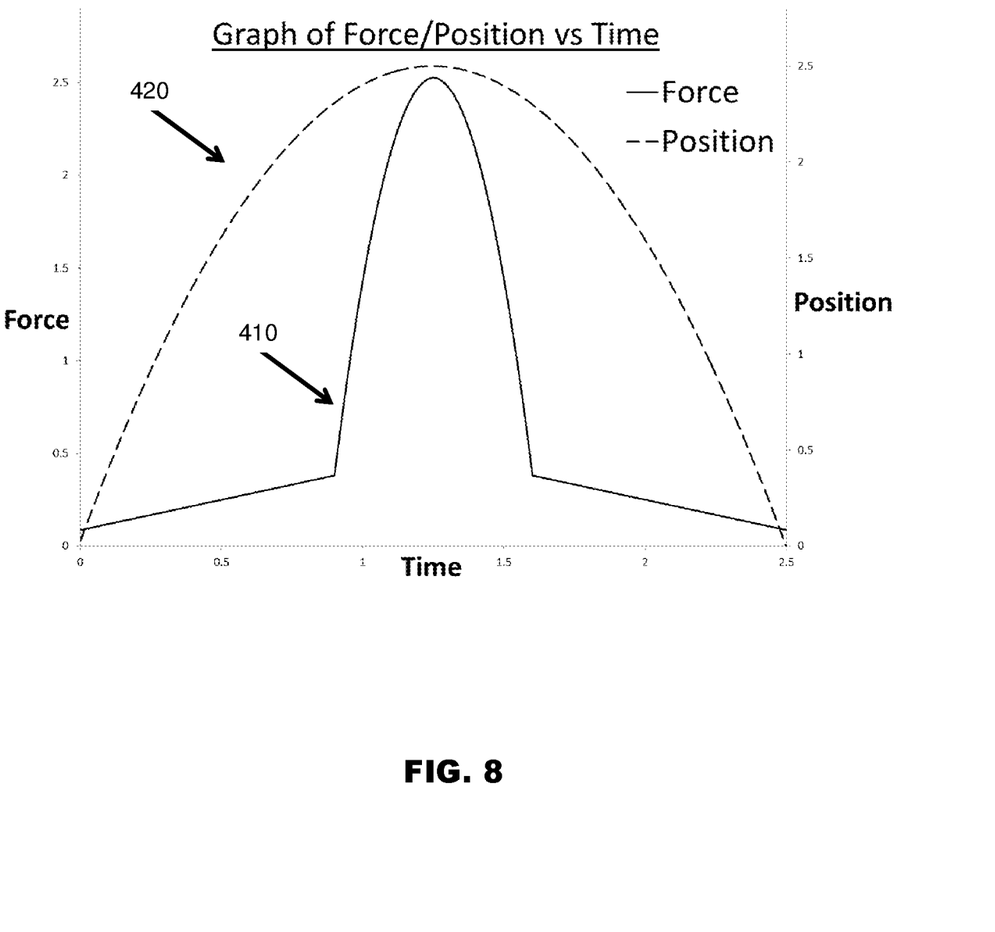
FIG. 8 is a force-time graph superimposed on a position-time graph.

FIGS. 7A-7C are for illustrative purposes only, using specific examples to elucidate the broader working principles of the present invention. It should therefore be appreciated that other types of sensors may be used and the variations or graphs plotted from collected data may have different shapes from those shown in FIGS. 7A-7C. In fact, the computer 80 may perform different and more complex or detailed analyses to detect anomalies in the press 10. For instance, the computer 80 may superimpose a force-time variation or force-time graph 410 on a position-time variation or position-time graph 420, as shown in FIG. 8, to perform more complex or detailed analyses.

A normal graph or an expected variation, together with an upper limit and a lower limit of the expected variation of a parameter during normal operation of the press when there is no failure, may be used by the computer 80 for comparison with a present variation or an actual graph plotted from collected data. The present variation of the parameter at different positions of the first die-set part relative to the second die-set part may be compared against the expected variation of the parameter at positions of the first die-set part relative to the second die-set part, wherein the expected variation of the parameter is with respect to a normal operation of the press when there is no failure while punching the workpiece 38. The parameter may comprise a location of the first die-set part relative to the second die-set part while punching the semiconductor device, or a pressing force exerted by a punch 60 on the semiconductor device while punching the workpiece 38. The expected variation, upper limit and lower limit, may, for instance, be user-defined, calculated from historical data, or derived from a calibration run. As long as the present variation is within the upper and lower limits of the expected variation of the parameter during normal operation of the press 10 when there is no failure, the processing cycle would be deemed normal. However, if the present variation falls outside of the upper limit or the lower limit of the expected variation of the parameter during normal operation of the press 10 when there is no failure, then the computer 80 would analyze the data to determine and identify the possible failures that are being encountered. Thereafter, the computer 80 may sound an alarm and indicate what the possible failures are, as well as suggest ways to rectify each failure. Alternatively, the press 10 may be stopped immediately or at the end of the processing cycle.

Although the present invention has been described in considerable detail with reference to certain embodiments, other embodiments are possible.

For example, instead of locating the position scale bar 66 at the bottom die-set housing 34 and the position sensor 68 at the top die-set housing 32, the locations for the position scale bar 66 and the position sensor 68 may be swapped or relocated to other suitable locations.

In addition, the position sensor 68 and the force sensor 26 may both be attached to either the top die-set housing 32 or the bottom die-set housing 34. Alternatively, the position sensor 68 and the force sensor 26 may each be located on a different die-set housing 32, 34. Furthermore, the position sensor 68 and the force sensor 26 may both be comprised in a single sensor.

Therefore, the spirit and scope of the appended claims should not be limited to the description of the embodiments contained herein.

The invention claimed is:

1. A method of detecting a failure in a press for punching and shaping semiconductor devices during a processing cycle, the press comprising a first die-set part, a second die-set part, and components in the form of an intermediate plate disposed between the first and second die-set parts, a plate stopper installed on the second die-set part, first and second die-set stoppers, a resilient member and a punch assembly, the method comprising the steps of:
    locating a semiconductor device between the first die-set part and the second die-set part of the press;
    moving the first die-set part and the second die-set part relative to each other for punching and shaping the semiconductor device therebetween;
    monitoring at least one parameter with at least one sensor attached to the first die-set part and/or the second die-set part at different positions of the first die-set part when the first die-set part is moving relative to the second die-set part during an entire processing cycle, the entire processing cycle including moving the first and second die-set parts from an open position where the first and second die-set stoppers are spaced from each other to a closed position where the plate stopper is arranged to contact the intermediate plate to prevent relative motion between the intermediate plate and the second die-set part, and the first and second die-set stoppers contact each other, and the resilient member is configured to be compressed to provide a reaction force to oppose relative motion between the first die-set part and the intermediate plate after the plate stopper is in contact with the intermediate plate, and then from the closed position back to the open position, while punching and shaping the semiconductor device with the punch assembly;
    comparing a present variation of the at least one parameter as represented by a sloping portion of a present variation graph showing the present variation of the at least one parameter at the different positions of the first die-set part relative to the second die-set part against an expected variation of the at least one parameter as represented by a sloping portion of a normal variation graph showing a normal variation of the at least one parameter at the different positions of the first die-set part relative to the second die-set part during normal operation of the press when there is no failure while punching and shaping the semiconductor device; and
    determining that a failure has occurred in the said components in the press when the present variation of the at least one parameter as represented by the sloping portion of the present variation graph is different from the expected variation of the at least one parameter as represented by the sloping portion of the normal variation graph.

2. The method of claim 1, wherein the step of determining that the failure has occurred in the press comprises the step of determining that the present variation is outside an upper limit or a lower limit of the expected variation of the at least one parameter during the normal operation of the press when there is no failure.

3. The method of claim 1, wherein the at least one sensor comprises a position sensor.

4. The method of claim 3, wherein the at least one parameter comprises a location of the first die-set part relative to the second die-set part while punching and shaping the semiconductor device.

5. The method of claim 4, wherein the present variation of the at least one parameter comprises locations of the first die-set part relative to the second die-set part over time during the normal operation of the press while punching and shaping the semiconductor device.

6. The method of claim 1, wherein the at least one sensor comprises a force sensor.

7. The method of claim 6, wherein the at least one parameter comprises a pressing force exerted by a punch on the semiconductor device while punching and shaping the semiconductor device.

8. The method of claim 7, wherein the present variation comprises the pressing force exerted by the punch on the semiconductor device over time during the operation of the press while punching and shaping the semiconductor device.

9. The method of claim 6, wherein the force sensor is coupled to a punch in the first die-set part and/or the second die-set part.

10. The method of claim 1, wherein the at least one sensor comprises:
a first sensor comprising a position sensor; and a second sensor comprising a force sensor.

11. The method of claim 10, wherein the at least one parameter further comprises:
a first parameter with respect to locations of the first die-set part relative to the second die-set part while punching and shaping the semiconductor device; and
a second parameter with respect to a pressing force exerted by a punch on the semiconductor device while punching and shaping the semiconductor device.

12. The method of claim 10, wherein:
the position sensor is mounted to the first die-set part; and
the force sensor is coupled to the second die-set part.

13. An apparatus for detecting a failure in a press for punching and shaping semiconductor devices during a processing cycle, the press comprising a first die-set part and a second die-set part which are movable relative to each other for punching and shaping a semiconductor device located therebetween, and components in the form of an intermediate plate disposed between the first and second die-set parts, a plate stopper installed on the second die-set part, first and second die-set stoppers, a resilient member and a punch assembly, the apparatus comprising:
at least one sensor attached to the first die-set part and/or the second die-set part for monitoring at least one parameter at different positions of the first die-set part when the first die-set part is moving relative to the second die-set part during an entire processing cycle, the entire processing cycle including moving the first and second die-set parts from an open position where the first and second die-set stoppers are spaced from each other to a closed position where the plate stopper is arranged to contact the intermediate plate to prevent relative motion between the intermediate plate and the second die-set part, and the first and second die-set stoppers contact each other, and the resilient member is configured to be compressed to provide a reaction force to oppose relative motion between the first die-set part and the intermediate plate after the plate stopper is in contact with the intermediate plate, and then from the closed position back to the open position, while punching and shaping the semiconductor device with the punch assembly; and
a processor for comparing a present variation of the at least one parameter as represented by a sloping portion of a present variation graph showing the present variation of the at least one parameter at the different positions of the first die-set part relative to the second die-set part against an expected variation of the at least one parameter as represented by a sloping portion of a normal variation graph showing a normal variation of the at least one parameter at the different positions of the first die-set part relative to the second die-set part during normal operation of the press when there is no failure while punching and shaping the semiconductor device;
wherein the processor is operative to determine that a failure has occurred in the said components in the press when the present variation of the at least one parameter as represented by the sloping portion of the present variation graph is different from the expected variation of the at least one parameter as represented by the sloping portion of the normal variation graph.

14. The apparatus of claim 13, wherein the at least one sensor comprises a position sensor for detecting a location of the first die-set part relative to the second die-set part.

15. The apparatus of claim 13, wherein the at least one sensor comprises a force sensor for detecting a pressing force exerted by a punch on the semiconductor device.

16. The apparatus of claim 14, further comprising a position scale bar attached to the second die-set part for cooperating with the position sensor to determine a distance between the first die-set part and the second die-set part.

17. A method of detecting a failure in a press for punching and shaping semiconductor devices during a processing cycle, the press comprising a first die-set part, a second die-set part, components in the form of an intermediate plate disposed between the first and second die-set parts, a plate stopper installed on the second die-set part, first and second die-set stoppers, a resilient member and a punch assembly, the method comprising the steps of:
locating a semiconductor device between the first die-set part and the second die-set part of the press;
moving the first die-set part and the second die-set part relative to each other for punching and shaping the semiconductor device therebetween;
monitoring at least one parameter with at least one sensor attached to the first die-set part and/or the second die-set part at different positions of the first die-set part when the first die-set part is moving relative to the second die-set part during an entire processing cycle including moving the first and second die-set parts from an open position where the first and second die-set stoppers are spaced from each other to a closed position where the plate stopper is arranged to contact the intermediate plate to prevent relative motion between the intermediate plate and the second die-set part, and the first and second die-set stoppers contact each other, and the resilient member is configured to be compressed to provide a reaction force to oppose relative motion between the first die-set part and the intermediate plate after the plate stopper is in contact with the intermediate plate, and then from the closed position back to the open position, while punching and shaping the semiconductor device with the punch assembly;
producing a present graph of force against position with respect to different positions of the first die-set part relative to the second die-set part;
comparing the present graph of force against position against a normal graph of force against position with respect to different positions of the first die-set part relative to the second die-set part during normal operation of the press when there is no failure while punching and shaping the semiconductor device; and determining that a failure has occurred in the said components in the press when the present graph of force against position is different from the normal graph of force against position.

\* \* \* \* \*